(12) United States Patent
Yagawa

(10) Patent No.: US 11,353,788 B2
(45) Date of Patent: Jun. 7, 2022

(54) METHOD OF MANUFACTURING SUBSTRATE AND IMPRINT APPARATUS

(71) Applicant: KIOXIA CORPORATION, Tokyo (JP)

(72) Inventor: Keisuke Yagawa, Yokohama Kanagawa (JP)

(73) Assignee: KIOXIA CORPORATION, Tokyo (JP)

(*) Notice: Subject to any disclaimer, the term of this patent is extended or adjusted under 35 U.S.C. 154(b) by 553 days.

(21) Appl. No.: 16/291,622

(22) Filed: Mar. 4, 2019

(65) Prior Publication Data

US 2020/0081339 A1 Mar. 12, 2020

(30) Foreign Application Priority Data

Sep. 6, 2018 (JP) .............................. JP2018-167203

(51) Int. Cl.
*G03F 7/00* (2006.01)
*B82Y 10/00* (2011.01)
*B82Y 40/00* (2011.01)
*B29C 59/02* (2006.01)

(52) U.S. Cl.
CPC ...... *G03F 7/0002* (2013.01); *B29C 2059/023* (2013.01); *B82Y 10/00* (2013.01); *B82Y 40/00* (2013.01)

(58) Field of Classification Search
None
See application file for complete search history.

(56) References Cited

U.S. PATENT DOCUMENTS 8,734,701 B2  5/2014  Kawakami
2010/0314798 A1* 12/2010  Kawakami ............. B82Y 10/00
                                                         264/293
2012/0072003 A1  3/2012  Matsuoka et al.

FOREIGN PATENT DOCUMENTS

JP           2018006379 A       1/2018

* cited by examiner

*Primary Examiner* — Joshua D Zimmerman
(74) *Attorney, Agent, or Firm* — Kim & Stewart LLP

(57) ABSTRACT

A method of patterning a substrate includes dispensing droplets of a resist onto a first region and a second region of a surface, pressing a patterned portion of an imprint template into the resist in the first region, curing the resist on the surface, and then removing the imprint template from the resist. An image of the resist in the second region is acquired to evaluate wettability of the resist. In some examples, the evaluation of wettability may be performed by image analysis on the acquired image and used in determining whether or not the patterning of the substrate was successful or likely to have been successful.

19 Claims, 10 Drawing Sheets

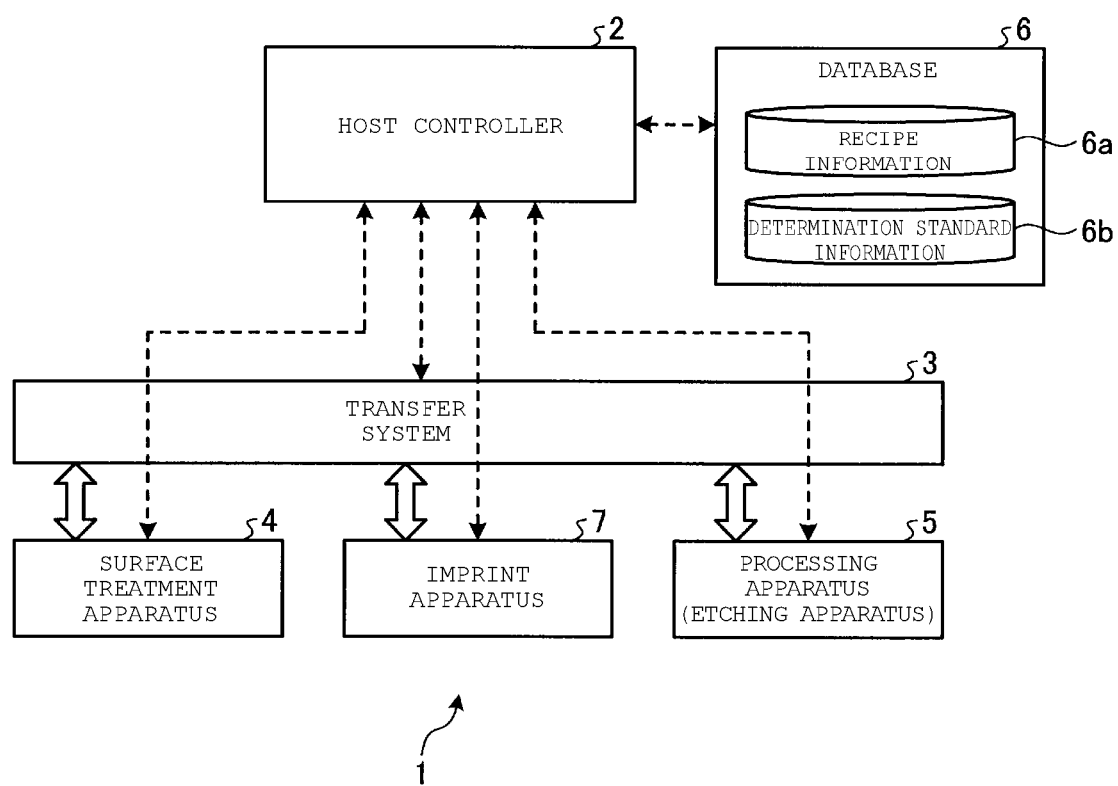

METHOD OF MANUFACTURING SUBSTRATE AND IMPRINT APPARATUS

CROSS-REFERENCE TO RELATED APPLICATION

This application is based upon and claims the benefit of priority from Japanese Patent Application No. 2018-167203, filed Sep. 6, 2018, the entire contents of which are incorporated herein by reference.

FIELD

Embodiments described herein relate generally to a method of manufacturing a substrate and an imprint apparatus.

BACKGROUND

A method of manufacturing a substrate in related art includes dropwise application of a resist onto a substrate, pressing a patterned surface of of an original plate (template) into the resist on the substrate, curing the resist, releasing the original plate from the substrate, and then transferring the pattern of formed in the resist into the substrate or a layer thereon. In such a process, it is desired to form an appropriate pattern on the substrate.

DESCRIPTION OF THE DRAWINGS

FIG. 2 is a diagram showing a configuration of an imprint system used in a method of manufacturing a substrate according to an embodiment.

DETAILED DESCRIPTION

Figure 1:
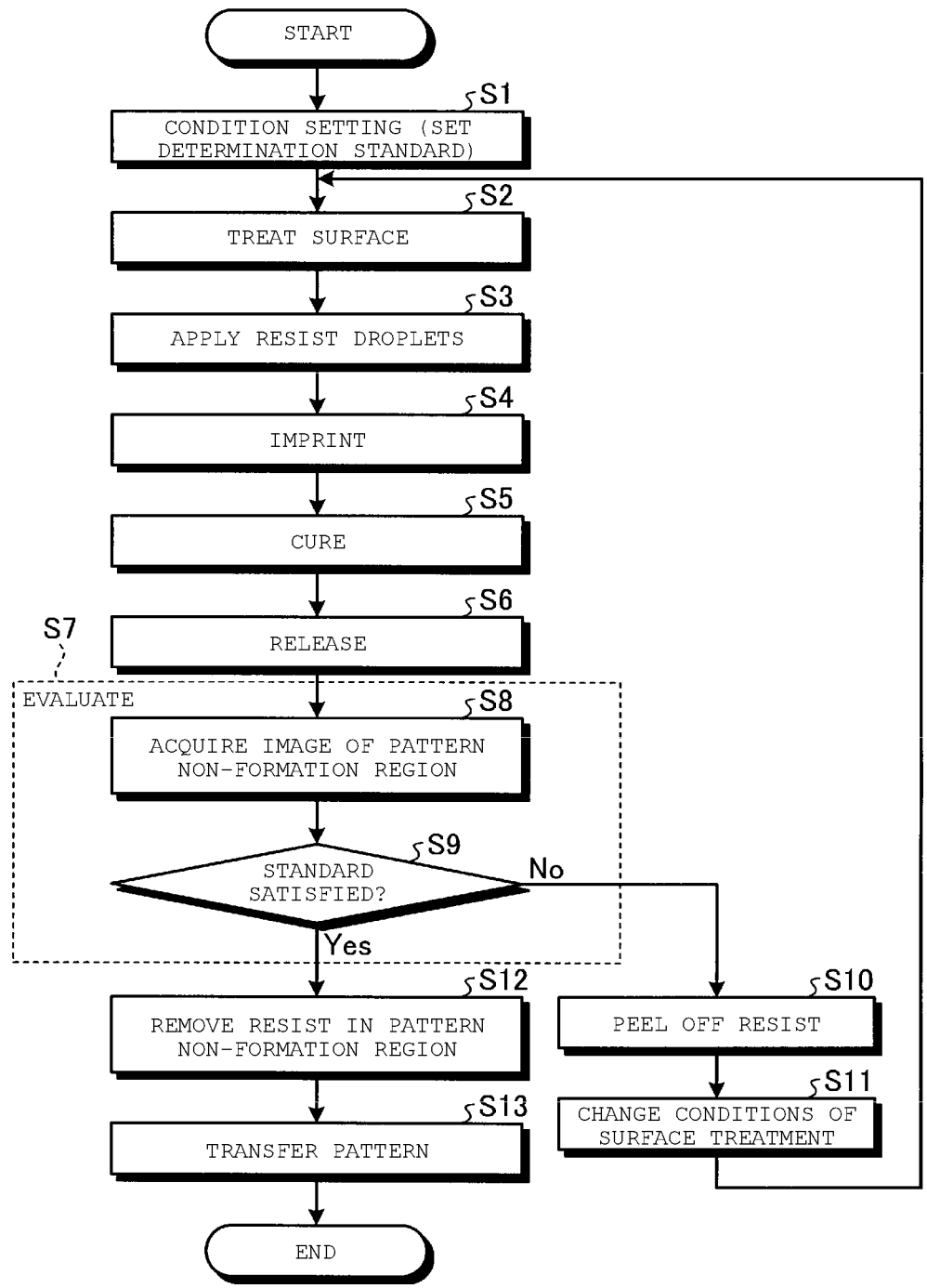
FIG. 1 is a flowchart of aspects of a method of manufacturing a substrate according to an embodiment.

In general, according to one embodiment, a method of patterning a substrate includes dispensing droplets of a resist onto a first region and a second region of a surface, pressing a patterned portion of an imprint template into the resist in the first region, curing the resist on the surface, removing the imprint template from the resist, and acquiring an image of the resist in the second region to evaluate wettability of the resist.

Hereinafter, an example of a method of manufacturing a substrate according to an embodiment will be described in detail with reference to the accompanying drawings. However, it should be noted that the present disclosure is not limited by this example embodiment.

Embodiment

A method of manufacturing a substrate according to an embodiment will be described. For a manufacture of semiconductor devices, nanoimprint lithography attracts attention as a method for forming fine patterns on a wafer.

For example, for the manufacture of a wafer using an imprinting method, a template on which a topographical pattern (textured surface) has been formed is brought into contact with a resist coated on a wafer. After curing the resist, the template is released from the cured resist, whereby a resist pattern having a pattern corresponding to the template pattern is formed on the wafer. Thereafter, the fine pattern is formed on the wafer by processing the wafer using the resist pattern as a mask material in processing such as etching or the like.

Prior to the manufacture of the wafer, a template itself may be manufactured using an imprinting method. That is, a pattern to be imprinted onto the wafer is formed on the template by an imprinting process (or otherwise). For the manufacture of many (high production volume) wafers, several templates be required. For this reason, a pattern is initially formed on a master template to be used as a mold of the manufacturing templates The maser template is first fabricated using an electron beam exposure apparatus or the like, and then several templates are manufactured from the master template by an imprint technique using the master template. Here, the templates produced from the master template may be referred to as replica templates or daughter templates in some instances.

As described above, an imprinting method may be used in both the manufacture of the replica templates and wafers. That is, a method of manufacturing a substrate, whether the substrate is a replica template or a wafer, uses an imprinting method that includes dropwise application of a resist onto the substrate, pressing patterned original plate (whether a master template or a replica template) into the resist on a substrate, curing the resist, releasing the original plate from the substrate, and then transferring the resist pattern into the substrate. For the manufacture of a replica template, the original plate is the master template and the substrate is a replica template blank. In the manufacture of a wafer, the original plate is a replica template and the substrate is the wafer to be patterned.

For example, in the manufacture of a replica template, when the replica template includes a material containing quartz glass as a main component, the surface of the substrate may be such as to repel the resist. In this case, any non-uniformity in distribution of the resist increases when the resist is supplied to the pattern formation region on the surface of the substrate, and during the pressing of the pattern of the original plate against the pattern formation region on the surface of the substrate and the filling of the resist in the pattern. For example, short shot defects, that is, areas of the template pattern where the resist does not flow (fill) are more likely to occur. When a pattern defect in the resist occurs, such a pattern defect may accordingly be present in the pattern as finally transferred into the substrate.

In the present embodiment, the resist is applied dropwise not only on a pattern formation region of the substrate, but also on a pattern non-formation region on the substrate, which a region of the substrate in which no template pattern is intended to be transferred. After the releasing, the wettability of the resist is evaluated on the basis of the planar shape of the resist in the pattern non-formation region, and pattern transfer is performed when the wettability of the resist satisfies a predetermined standard, thereby preventing pattern defects in the manufacture of the substrate and also forming an appropriate pattern.

Specifically, preparing a replica template from a master template includes following processes (1) to (5):

(1) Incorporating a droplet-based process for determining wettability of resist into the droplet recipe. Since it is impossible to determine the wettability in the pattern formation region once it has been imprinted, the drops used for wettability determination are placed outside the pattern formation region.

(2) The droplet recipe incorporating the droplet-based process (developed in process (1)) for determining the wettability of the resist is applied for dispensing resist droplets onto the substrate. This is followed by imprinting with the template and then releasing the template.

(3) After releasing, an image of the droplets for determining the wettability of the resist applied on the region outside of the imprinting region is captured with a camera. It is preferable that an arrangement be made in advance that allows the number of points for image capturing and their coordinates to be automatically captured by reference to the droplet arrangement.

(4) A quality determination is performed for the image(s) captured in process (3). Regarding a method of the determination, the following methods (i) and (ii) may be adopted or considered. If at least one of the determination methods (i) and (ii) is used, it is possible to determine whether or not there is a problem in the surface condition (that is, wettability) of the substrate.

(i) A wettability image for the normal surface state is registered in advance and determination is made by checking whether or not the image captured after the imprint process matches with the registered image.

(ii) The sizes and outlines of drops in the normal state are quantified and registered, and determination is made by comparing these stored values with numerical values acquired from images captured for the manufacturing substrates.

(5) Those substrates that are determined as failing (not meeting the conditions established for the normal state) in process (4) are not allowed to proceed to the substrate machining process (etching), and may be treated as items to be reused/reworked after a resist peeling off treatment, to prevent waste of the substrate. On the other hand, those determined meeting (passing) the established conditions for the normal state proceed to the subsequent machining process.

More specifically, a method of manufacturing the substrate is carried out as shown in FIG. 1. FIG. 1 is a flowchart showing a method of manufacturing a substrate. Hereinafter, a case where an original plate is a master template and the substrate is a replica template will be described as an example, but the examples described below may also be applied to a case where the original plate is the replica template and the substrate is a wafer.

First, as a condition setting for evaluating a wettability of the substrate, a standard for determining the wettability is determined (S1). While the wettability of the resist with respect to a surface of the substrate is defined by the contact angle formed by the edge of the resist droplet and the surface of the substrate, the wettability of the resist can also be evaluated based on change in the planar shape of the resist without directly evaluating the contact angle itself.

Several different substrates having different surface wettability are prepared, and the processes of S2 to S7 and S11 and S12 are performed on each of the substrates, and the degree of occurrence of pattern defects on the substrate is evaluated by electron microscope (SEM or TEM) or the like. Then, acceptable (good) wettability is determined by the degree of occurrence of pattern defects. For example, when the number and/or density of pattern defects is within an acceptable range, wettability is considered good, while poor wettability is considered to occur when the degree of occurrence of pattern defects is outside the acceptable range.

In consideration of the need for mass production (high volume production), it is preferable to evaluate the wettability in a short time. In general, an optical camera already used for alignment purposes in an imprint apparatus may be adapted as an evaluation apparatus for determining the wettability according to this embodiment. The wettability may be determined using an optical camera already normally present in an imprint tool or may be a dedicated camera specifically provided for this purpose.

In general, the standard set for determining the wettability may be any standard that permits determination of the wettability using an image of the pattern non-formation region. For example, the standard for determining the wettability may be the matching to a standard image showing the planar shape of the resist with the good wettability that is acquired experimentally in advance, an outline pattern of a droplet of a resist with the good wettability that is acquired experimentally in advance, a threshold value of the average size of droplets of resist with the good wettability that is acquired experimentally in advance, a threshold value of the roundness of the outline of the droplet of the resist with the good wettability that is acquired experimentally in advance, and/or a threshold value of the ratio of the area occupied by the resist with the good wettability that is acquired experimentally in advance.

The standard for determining the wettability may be stored in database 6 as determination standard information 6b in the imprint system 1 shown in FIG. 2. FIG. 2 is a diagram showing a configuration of an imprint system 1 used for a method of manufacturing a substrate.

The imprint system 1 includes a host controller 2, a transfer system 3, a surface treatment apparatus 4, an imprint apparatus 7, a processing apparatus 5, and a database 6. The surface treatment apparatus 4, the imprint apparatus 7, and the processing apparatus 5 are configured to be capable of transferring substrates among themselves through the transfer system 3. The host controller 2 is connected to the transfer system 3, the surface treatment apparatus 4, the imprint apparatus 7, and the processing apparatus 5 so as to communicate with them through a communication line or bus. The processing apparatus 5 is an etching apparatus and may perform wet etching and/or dry etching. The host controller 2 controls the transfer system 3, the surface treatment apparatus 4, the imprint apparatus 7, and the processing apparatus 5, respectively, and may refer to the database 6. In addition to the determination standard information 6b, the database 6 may store recipe information 6a defining the processing conditions in the respective processes described below for the substrate.

Figure 3A:
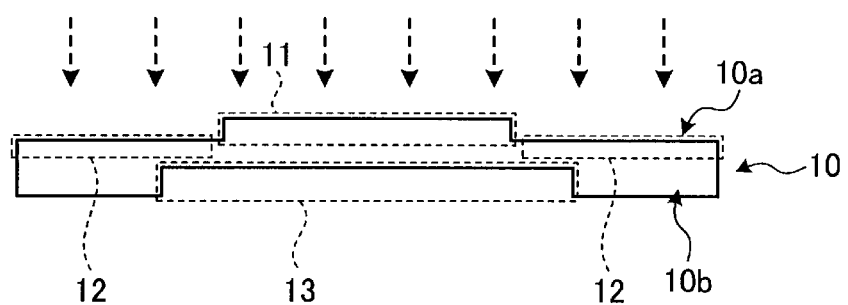
FIGS. 3A and 3B depict aspects of a surface treatment process in a method of manufacturing a substrate according to an embodiment.
Figure 3B:
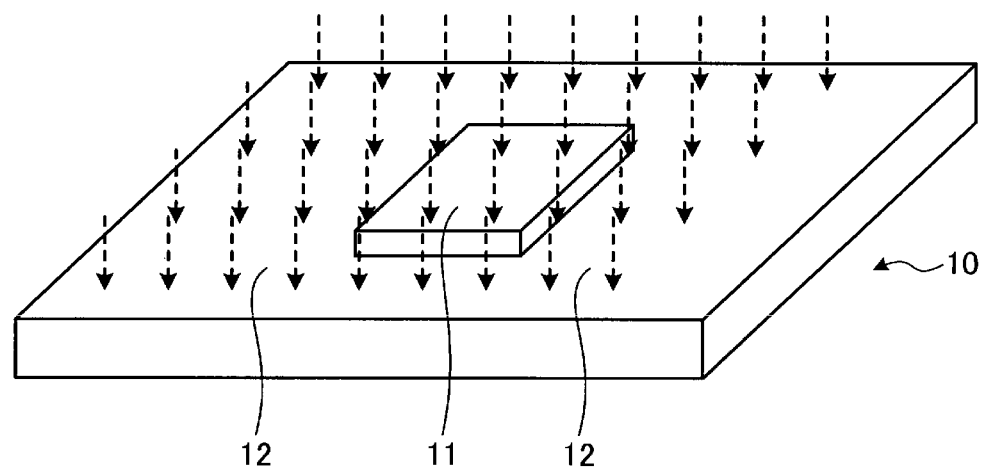

When the substrate 10 is carried in by the transfer system 3, the surface treatment apparatus 4 performs surface treatment of the substrate 10 (S2 in FIG. 1). The surface treatment apparatus 4 performs a surface treatment for modifying a surface 10*a* of the substrate 10 to have an affinity for the resist for a predetermined processing time. As shown in FIGS. 3A and 3B, the surface treatment apparatus 4 performs a treatment of vaporizing a silane coupling agent and depositing the vapor on the surface 10*a* of the substrate 10, so that the adhesion layer 14 (see FIG. 5A) is formed on the surface 10*a*. The adhesion layer 14 is a layer that brings the resist into close contact with the substrate 10 and may be formed in the vicinity of the surface 10*a*. FIG. 3A is a cross-sectional view showing the surface treatment process in the method of manufacturing the substrate 10, and FIG. 3B is a perspective view showing the surface treatment process in the method of manufacturing the substrate 10.

In replica imprinting using a master template, the transfer is performed between the original plate and the substrate. In this case, when the original plate and the substrate each includes a material containing quartz glass as a main component, when contact surfaces of the same size are brought into contact with each other, a strong attractive force may be generated, making it difficult to release the original plate from the substrate in some cases. Therefore, it is desirable to provide a mesa-like step (for example, step of several tens of μm) on the pattern surface of the substrate (replica template).

That is, in the substrate 10, the pattern formation region 11 is protruded in a pedestal shape with respect to the pattern non-formation region 12. The pattern formation region 11 is also referred to as a mesa region or a protruded surface region. When viewed from the direction perpendicular to the surface 10*a* of the substrate 10, the pattern non-formation region 12 is arranged around the pattern formation region 11, for example surrounding the pattern formation region 11. The surface treatment apparatus 4 may perform a surface treatment for modifying both the pattern formation region 11 and the pattern non-formation region 12 to have an affinity for the resist (lipophilicity).

Further, in order to facilitate imprinting and releasing, the original plate or the substrate (or both) may have a structure that is bendable/flexible. Therefore, a gouging out (or core-out process) called counterboring may be performed on the rear surface of both the original plate (master template) and the substrate (replica template). The substrate 10 may further have an opening region 13 opened on the side of the rear surface 10*b*. As a result, it is possible to avoid an impracticable releasing operation and to greatly improve pattern accuracy.

The transfer system 3 takes out the substrate 10 from the surface treatment apparatus 4 when the surface treatment of the substrate 10 by the surface treatment apparatus 4 is completed.

Figure 4:
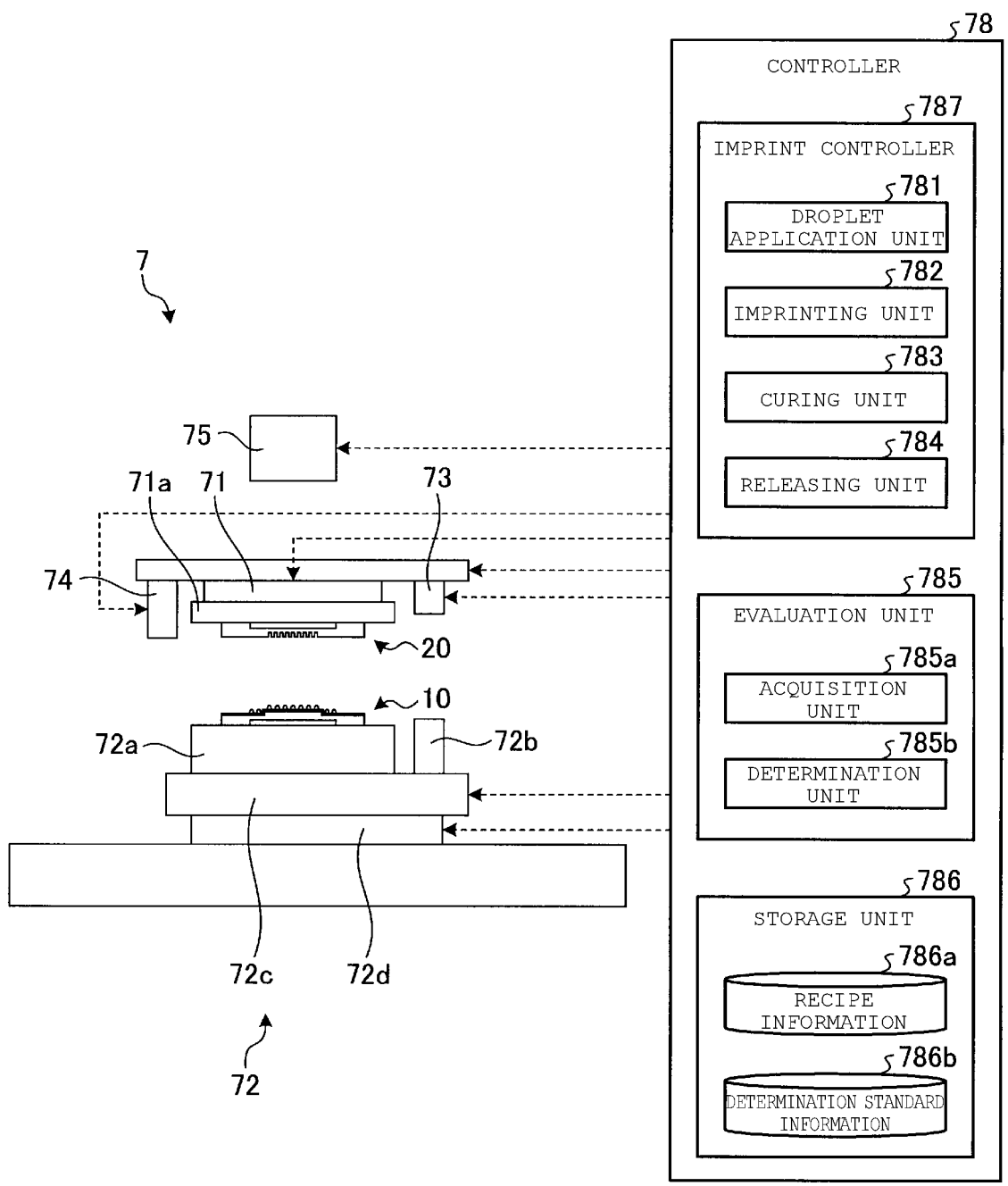
FIG. 4 is a diagram of an imprint apparatus used in a method of manufacturing a substrate according to an embodiment.

Once the substrate 10 is carried in by the transfer system 3, the imprint apparatus 7 drops a resist onto the surface of the substrate 10 (S3 in FIG. 1). The imprint apparatus 7 is configured as shown in FIG. 4, for example.

The imprint apparatus 7 includes an original plate (template) stage 71, a substrate stage 72, an optical camera 73, a liquid droplet dispensing device 74, a light source 75, and a controller 78. The original plate stage 71 includes an original plate chuck 71*a*, and holds an original plate 20 (for example, a master template) using the original plate chuck 71*a*. The substrate stage 72 includes a substrate chuck 72*a* and a standard mark 72*b*, and holds the substrate 10 (for example, a replica template) using the substrate chuck 72*a*. The camera 73 includes an optical system and an image sensor. The camera 73 may also be used as an alignment sensor and acquires the image(s) for the relative position adjustment of the original plate 20 and the substrate 10 by capturing a reference mark 72*b*. The liquid droplet dispensing device 74 is an ejecting portion that dispenses droplets of resist, including the droplets of resist for wettability evaluations, onto a substrate, and is also referred to as a dispenser. The controller 78 includes a dropwise application unit 781, an imprinting unit 782, a curing unit 783, a releasing unit 784, an evaluation unit 785, and a storage unit 786. The evaluation unit 785 includes an acquisition unit 785*a* and a determination unit 785*b*. The storage unit 786 stores the recipe information 6*a* and the determination standard information 6*b* acquired from the database 6 through the host controller 2 as recipe information 786*a* and the determination standard information 786*b*, respectively. The acquisition unit 785*a* controls the optical camera 73 and acquires an image captured by the optical camera 73 with respect to the surface 10*a* of the substrate 10. Though the optical camera 73 is utilized as an alignment sensor, it may also be utilized to acquire an image to be used for evaluations of wettability. The determination unit 785*b* determines the wettability of the surface 10*a* of the substrate 10 based on the acquired image(s) and the determination standard information 786*b*.

Figure 5A:
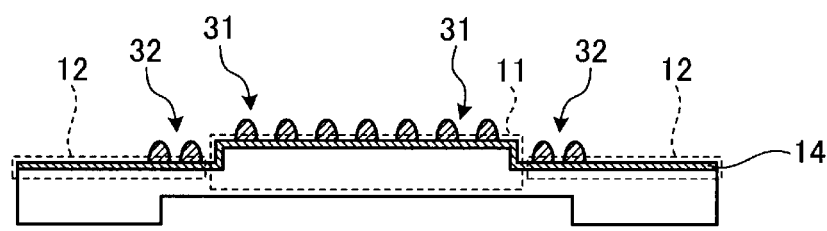
FIGS. 5A and 5B show aspects of a droplet application process of a method of manufacturing a substrate according to an embodiment.
Figure 5B:
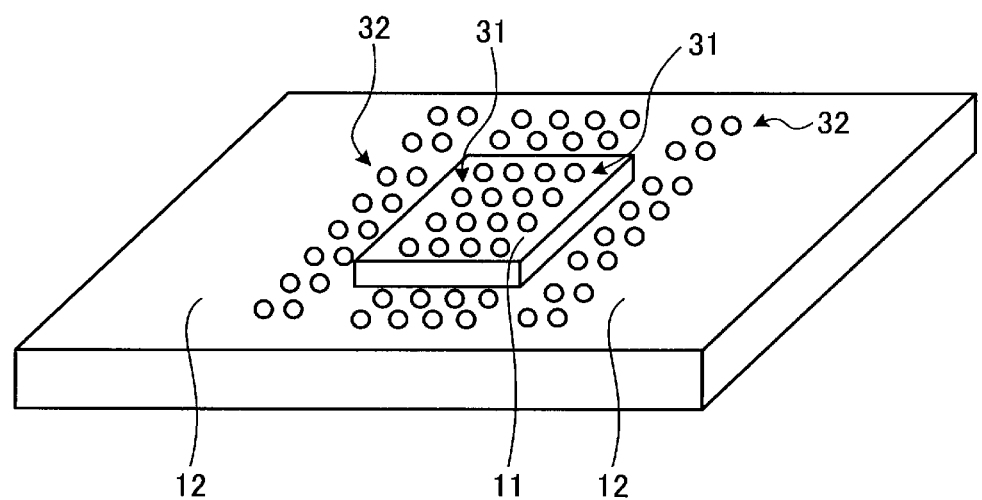

In the imprint apparatus 7, the dropwise application unit 781 of the controller 78 controls the liquid droplet dispensing device 74 based on the drop recipe included in the recipe information 786*a*, and as shown in FIGS. 5A and 5B, the resists 31 and 32 are applied dropwise onto the pattern formation region 11 and the pattern non-formation region 12 on the surface of the substrate 10, respectively. FIG. 5A is a cross-sectional view showing a dropwise application process of the method of manufacturing the substrate 10, and FIG. 5B is a perspective view showing a dropwise application process of the method of manufacturing the substrate 10.

A liquid in which a photo-curable resin is dissolved in an organic solvent may be used as the resists 31 and 32, for example. The portion where the resist 32 is applied as droplets in the pattern non-formation region 12 may be at least a partial region corresponding to the determination standard information 786*b*, or may be a partial region 12*a* (see FIG. 7B) in the pattern non-formation region 12 that is adjacent to the pattern formation region 11, as shown in FIGS. 5A and 5B.

Figure 6A:
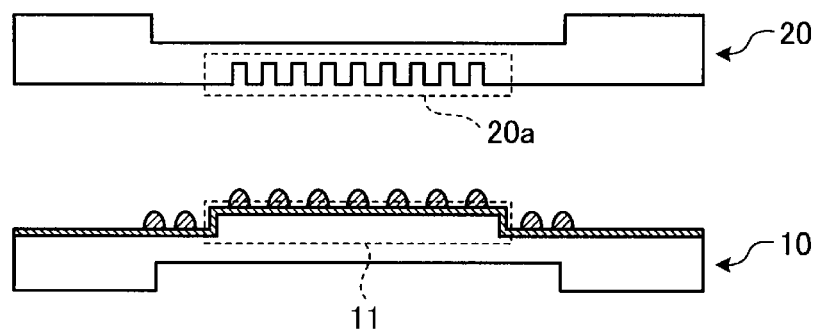
FIGS. 6A, 6B, and 6C depict aspects of an imprinting and curing process in a method of manufacturing a substrate according to an embodiment.
Figure 6B:
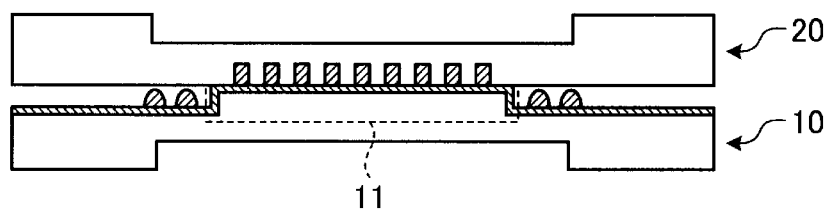
Figure 6C:
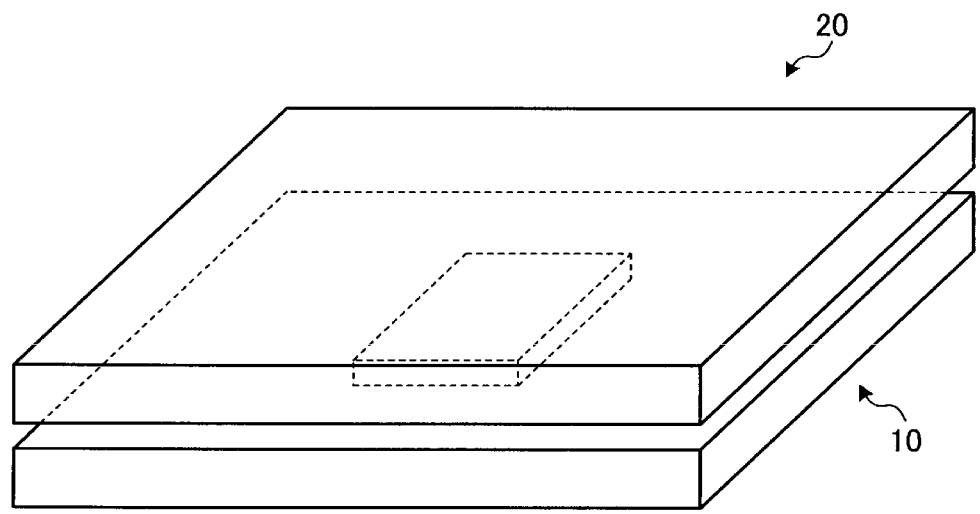

The imprint apparatus 7 performs an imprint on the substrate of the original plate (S4 in FIG. 1). That is, in the imprint apparatus 7, the imprinting unit 782 of the controller 78 controls the original plate stage 71 and/or the substrate stage 72 based on the recipe information 786*a*, such that as shown in FIGS. 6A, 6B, and 6C, the original plate 20 and the substrate 10 are brought relatively close to each other, whereby the pattern 20*a* of the original plate 20 is imprinted in the resist 31 of the pattern formation region 11 on the substrate 10. As a result, the resist 31 in the pattern formation region 11 flows into the pattern 20*a* of the original plate 20. FIGS. 6A and 6B are cross-sectional views showing an imprinting process of the method of manufacturing the substrate 10, and FIG. 6C is a perspective view showing an imprinting process of the method of manufacturing the substrate 10.

The imprint apparatus 7 cures the resist (S5 in FIG. 1). That is, in the imprint apparatus 7, the curing unit 783 of the controller 78 controls the light source 75 based on the recipe information 786*a*, and irradiates the resist on the substrate (replica template) 10 with exposure light such as UV light through the original plate (master template) 20, and photo-cures the resist.

Figure 7A:
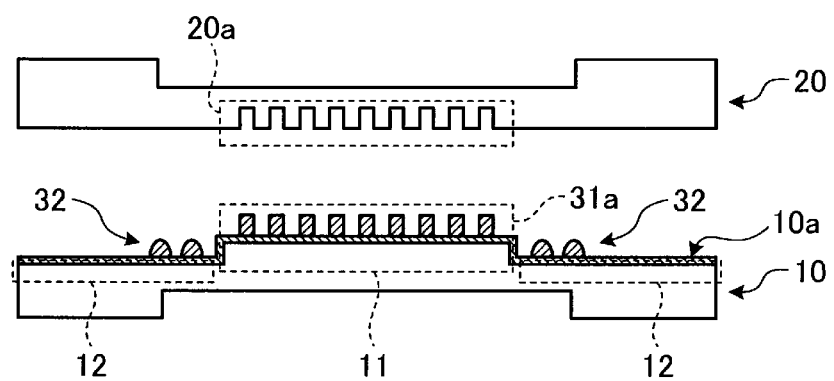
FIGS. 7A and 7B depict aspects of a releasing process in a method of manufacturing a substrate according to an embodiment.
Figure 7B:
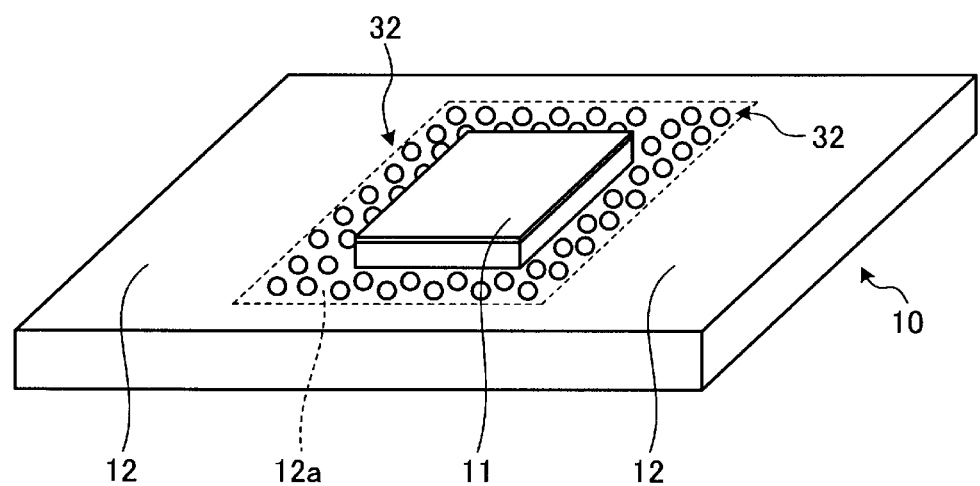

The imprint apparatus 7 pulls the original plate from the substrate (S6 in FIG. 1). That is, in the imprint apparatus 7, the releasing unit 784 of the controller 78 controls the original plate stage 71 and/or the substrate stage 72 based on the recipe information 786a, such that, as shown in FIGS. 7A and 7B, the original plate 20 and the substrate 10 are moved away from each other, and the pattern 20a of the original plate 20 is separated from the resist 31 on the substrate 10. As a result, a resist pattern 31a corresponding to the pattern 20a of the original plate 20 is formed. FIG. 7A is a cross-sectional view showing a releasing process of the method of manufacturing the substrate 10, and FIG. 7B is a perspective view showing a releasing process of the method of manufacturing the substrate 10. The resist 32 remains in the partial region 12a of the pattern non-formation region 12 on the surface 10a of the substrate 10.

The imprint apparatus 7 evaluates the wettability of the resist 32 (S7). That is, in the imprint apparatus 7, the evaluation unit 785 evaluates the wettability of the resist 32 based on the state (for example, the planar shape) of the resist 32 in the pattern non-formation region 12 on the substrate 10.

Figure 8A:
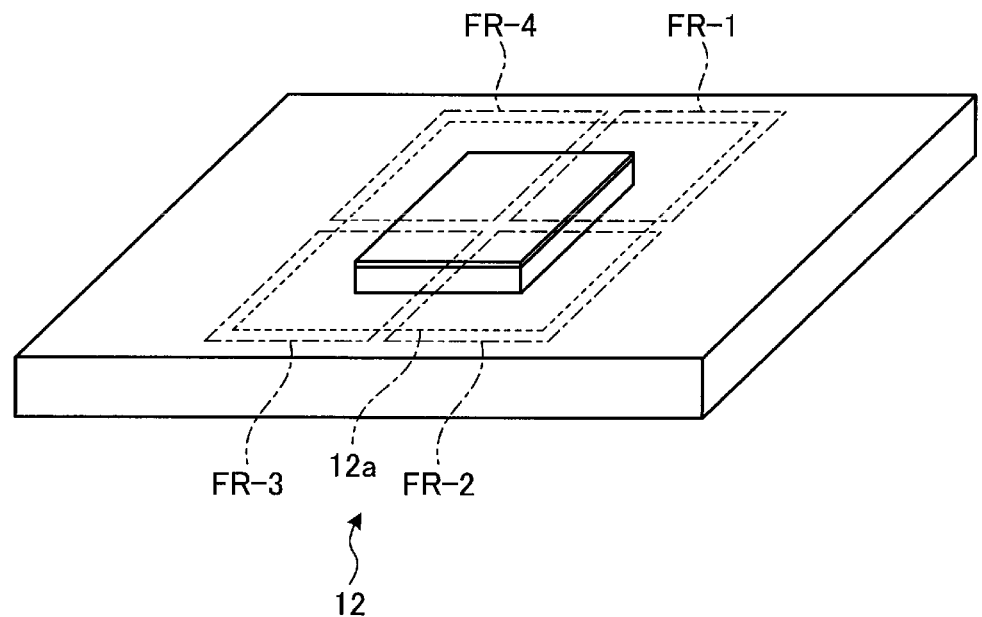
FIGS. 8A and 8B depict aspects of an evaluation process in a method of manufacturing a substrate according to an embodiment.
Figure 8B:
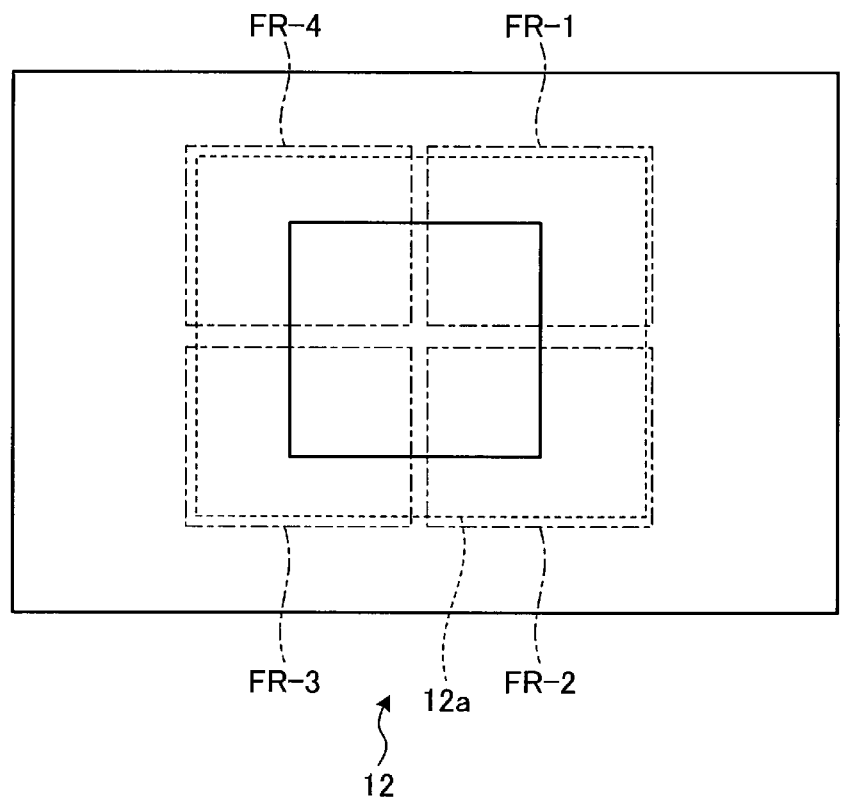

Specifically, S8 and S9 are performed in S7. The imprint apparatus 7 acquires an image of the pattern non-formation region 12 on the substrate 10 (S8). That is, in the imprint apparatus 7, the acquisition unit 785a may control the original plate stage 71 and the optical camera 73, and image while sequentially moving the original plate stage 71 in the X and Y directions so that the visual field ranges FR-1 to FR-4 of the optical camera 73 overlap the partial region 12a in the pattern non-formation region 12 as shown in FIGS. 8A and 8B. FIG. 8A is a perspective view showing an evaluation process of the method of manufacturing of the substrate 10, and FIG. 8B is a plan view showing an evaluation process of the method of manufacturing of the substrate 10. The acquisition unit 785a supplies the image from the optical camera 73 to the determination unit 785b.

The imprint apparatus 7 determines whether or not the wettability of the resist 32 satisfies the standard based on an evaluation of the acquired image (S9). That is, the determination unit 785b of the controller 78 determines whether or not the surface 10a of the substrate 10 satisfies the wettability standard based on the determination standard information 786b and the acquired image. That is, the determination unit 785b compares the acquired image with the standard image, and then determines whether or not the wettability of the resist satisfies the standard according to the result of the comparison.

Figure 9A:
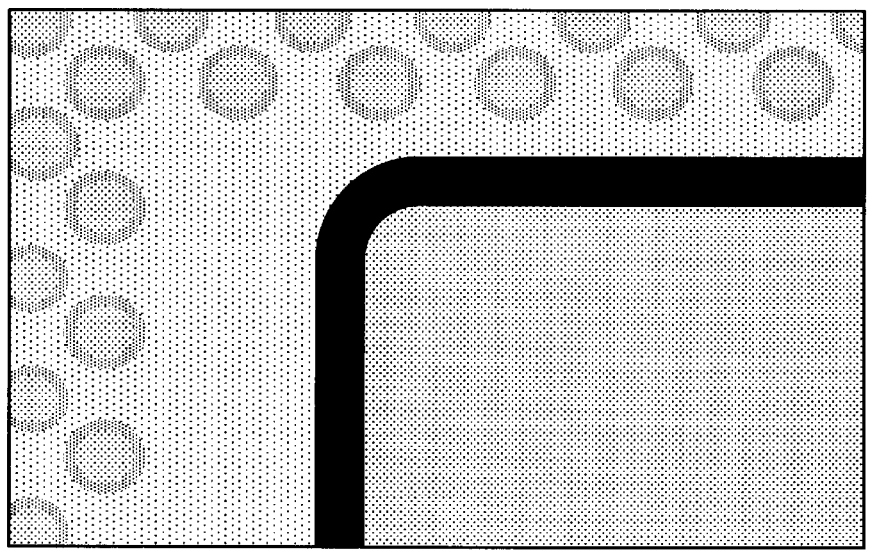
FIGS. 9A and 9B depict an image of a pattern non-formation region on a substrate according to an embodiment.
Figure 9B:
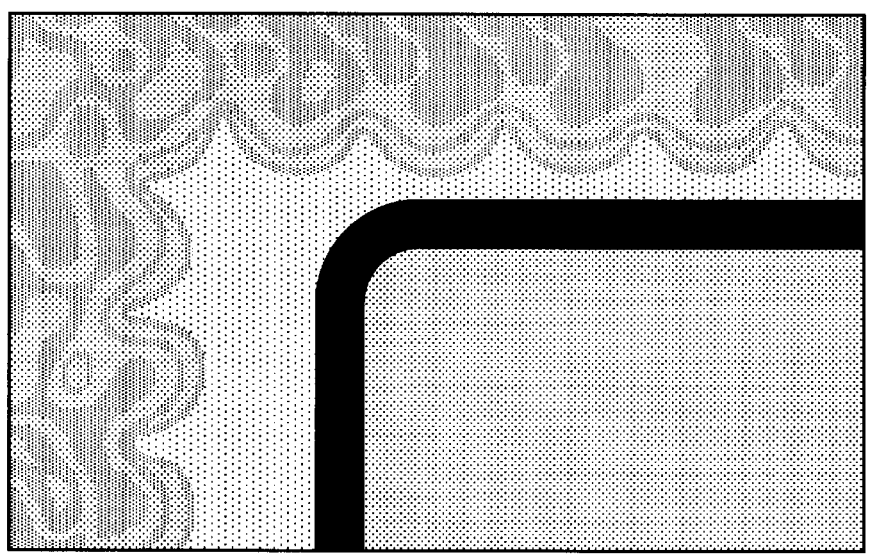

For example, the determination unit 785b checks whether or not the acquired image matches the standard image and acquires a matching score indicating the degree of match (or similarity) and it may be determined that the observed wettability satisfies the standard when the matching score exceeds a threshold value, and it may be determined that the observed wettability does not satisfy the standard when the matching score is lower than the threshold value. As an example, when the image shown in FIG. 9A is acquired, the determination unit 785b may determine that the matching score is lower than the threshold value and does not satisfy the standard. When the image shown in FIG. 9B is acquired, the determination unit 785b may determine that the matching score exceeds the threshold value and satisfies the standard. FIGS. 9A and 9B are views showing images including a portion of the pattern non-formation region 12 on different substrates 10, for example.

Alternatively, the determination unit 785b performs an outline extraction (edge detection) process on the acquired image, checks whether or not the extracted outline pattern of the resist matches with a standard outline pattern and acquires a matching score indicating the degree of matching. By the matching score it may be determined that the wettability satisfies the standard when the matching score exceeds the score threshold value, and it may be determined that the wettability does not satisfy the standard when the matching score is lower than the score threshold value. When the image shown in FIG. 9A is acquired, the determination unit 785b may determine that the matching score is lower than the score threshold value and thus does not satisfy the standard, and when the image shown in FIG. 9B is acquired, the determination unit 785b may determine that the matching score exceeds the score threshold value and thus satisfies the standard.

Alternatively, the determination unit 785b performs outline extraction (edge detection) processing on the acquired image and calculates or otherwise acquires an average size of the resist droplets in the image based on the extracted outline pattern. From the average size of resist droplets, it may be determined that the wettability satisfies a standard when the average size of the droplets exceeds a size threshold value and it may be determined that the wettability does not satisfy the standard when the average size of the droplets is lower than the size threshold value. When the image shown in FIG. 9A is acquired, the determination unit 785b may determine that the average size of the droplet is lower than the size threshold value and thus does not satisfy the standard. When the image shown in FIG. 9B is acquired, the determination unit 785b may determine that the average size of the droplets exceeds the size threshold value and thus satisfies the standard.

Alternatively, the determination unit 785b performs outline extraction (edge detection) processing on the acquired image and calculates or otherwise acquires a figure of roundness for the outlines of the resist droplet based on the extracted outline pattern, so that it may be determined that a standard is satisfied when the roundness of the outline is lower than a roundness threshold value, and it may be determined that the standard is not satisfied when the roundness of the outline exceeds the roundness threshold value. When the image shown in FIG. 9A is acquired, the determination unit 785b may determine that the roundness of the outline exceeds the roundness threshold value and does not satisfy the standard, and when the image shown in FIG. 9B is acquired, the determination unit 785b may determine that the roundness of the outline is lower than the roundness threshold value and satisfies the standard.

Alternatively, the determination unit 785b calculates or otherwise acquires the area occupied by resist in the acquired image, calculates a ratio of the area occupied by the resist to the entire area in the image (called here the area occupancy of the resist) and determines that the wettability satisfies a standard when the area occupancy exceeds an occupancy threshold value. It may be determined that the wettability does not satisfy the standard when the area occupancy of the resist is lower than the occupancy threshold value. When the image shown in FIG. 9A is acquired, the determination unit 785b may determine that the area occupancy of the resist is lower than the occupancy threshold value and does not satisfy the standard, and when the image shown in FIG. 9B is acquired, the determination unit 785b may determine that the area occupancy of the resist exceeds the occupancy threshold value and satisfies the standard.

When the imprint apparatus 7 determines that the wettability of the resist does not satisfy some standard (NO in S9), the determination result is sent from the imprint apparatus 7 to the host controller 2, and the substrate (replica template) 10 is removed from the imprint apparatus 7 to the transfer system 3.

The processing apparatus 5 may receive an instruction from the host controller 2 indicating that the resist is to be peeled off from the whole region. When the substrate 10 is carried off by the transfer system 3, the processing apparatus 5 can be used to peel off the resist from the whole region on the substrate 10 in accordance with the instruction from the host controller 2 (S10 in FIG. 1). The processing apparatus 5 peels off the resist by removing the resist pattern 31a and the resist 32 on the substrate 10 by wet etching, for example. When peeling of the resist is completed, the substrate (replica template) 10 is sent from the processing apparatus 5 to the transfer system 3.

The host controller 2 receives from the imprint apparatus 7 a determination result indicating that the wettability of the resist does not satisfy the standard, changes the conditions of the surface treatment on the substrate (replica template) 10 accordingly, and instructs the surface treatment apparatus 4 to use the new conditions for the surface treatment after the change (S11 of FIG. 1). As a result, in the subsequent S2, the surface treatment on the substrate (replica template) 10 may be performed under the conditions of the surface treatment after the change.

When the imprint apparatus 7 determines that the wettability of the resist satisfies the standard (YES in S9), the determination result is notified from the imprint apparatus 7 to the host controller 2, and the substrate (replica template) 10 is sent from the imprint apparatus 7 to the transfer system 3.

Figure 10A:
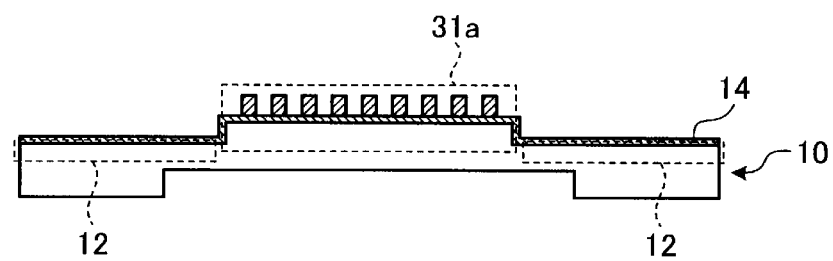
FIGS. 10A, 10B, and 10C depict aspects of a pattern transfer process in a method of manufacturing a substrate according to the embodiment.

The processing apparatus 5 may receive an instruction from the host controller 2 to selectively remove the resist in the pattern non-formation region. When the substrate 10 is removed by the transfer system 3, the processing apparatus 5 selectively removes the resist 32 in the pattern non-formation region 12 as shown in FIG. 10A in accordance with the instruction from the host controller 2 (S12 in FIG. 1). The processing apparatus 5 may selectively remove the resist 32 in the pattern non-formation region 12 by wet etching, for example.

Figure 10B:
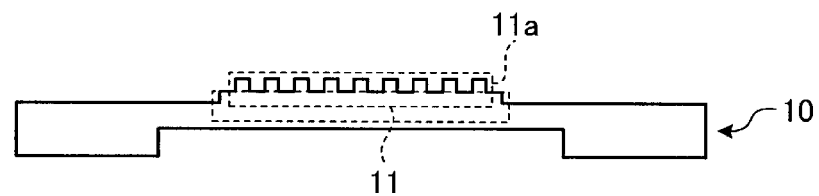
Figure 10C:
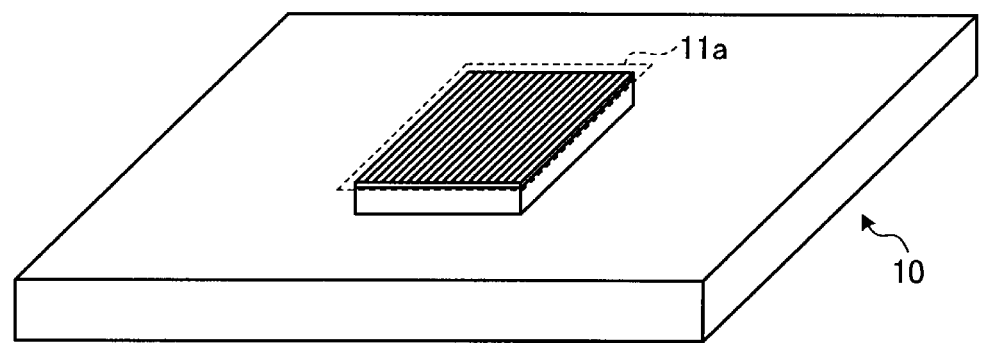

Next, the processing apparatus 5 receives an instruction from the host controller 2 to transfer the resist pattern 31a into the substrate 10. The processing apparatus 5 processes the resist pattern 31a as shown in FIGS. 10B and 10C (S13 in FIG. 1). The processing apparatus 5 transfer the resist pattern 31a into the substrate 10 by dry etching, for example. As a result, a pattern 11a, corresponding to the resist pattern 31a, is formed in the pattern formation region 11, and a replica template (a processed substrate 10) having the pattern 11a thereon is thus formed. At this time, the adhesion layer 14 may be removed.

As described above, the resist is applied as droplets on the pattern formation region and also the pattern non-formation region substrate. The wetting of the resist on the substrate is evaluated on the basis of the planar shape (s) of the resist droplets in the pattern non-formation region after releasing the imprint template. Pattern transfer processing is performed only if the observed wetting of the resist on the substrate satisfies some predetermined standard. As a result, in the manufacture of a replica template, the occurrence of pattern defects may be reduced and an appropriate pattern may be more reliably formed. In other words, since it may be determined beforehand whether or not pattern transfer process should actually be performed in the manufacture of the replica template, wasting of a substrate may be avoided by avoiding transfer attempts when resist is observed as insufficiently wetting the wafer/template and the manufacturing times may be shortened.

Examples of silane coupling agent used for the surface treatment for modifying an affinity for the resist include monoalkoxysilanes, dialkoxysilanes, trialkoxysilanes, monochlorosilanes, dichlorosilanes, trichlorosilanes, and the like. A silane coupling agent having a photo radical polymerizable group, a silane coupling agent having a photo cationic polymerizable group, or the like may be used as the adhesion layer which may be formed on the surface 10a of the substrate 10 by the surface treatment.

Examples of the adhesion layer 14 may include 3-(Trimethoxysilyl)propyl Acrylate, 3-[Diethoxy(methyl)silyl]propyl Methacrylate, 3-(Trimethoxysilyl)propyl Methacrylate, 3-[Tris(trimethylsilyloxy)silyl]propyl Methacrylate, 3-[Dimethoxy(methyl) silyl]propyl Methacrylate, 3-(Methoxydimethylsilyl)propyl Acrylate, 3-(Triethoxysilyl)propyl Methacrylate, 3-(Triallylsilyl)propyl Acrylate, 3-(Triallylsilyl)propyl Methacrylate, Diethoxy(3-glycidyloxypropyl) methylsilane, 3-Glycidyloxypropyltrimethoxysilane, 3-Glycidyloxypropyl(dimethoxy) methylsilane, [8-(Glycidyloxy)-n-octyl] trimethoxysilane, Triethoxy (3-glycidyloxypropyl)silane, and the like.

In addition, while FIGS. 6 and 7 illustrate a case where a gouging out (or core-out process), also called a counterbore, is performed on the rear surface of both the master template and the replica template, the counterbore may be provided only on the rear surface of the replica template and not on the rear surface of the master template. Alternatively, the counterbore may be on the rear surface of the master template and not on the rear surface of the replica template. Or, as depicted, both the master template and the replica template can have a counterbore.

While certain embodiments have been described, these embodiments have been presented by way of example only, and are not intended to limit the scope of the present disclosure. Indeed, the novel embodiments described herein may be embodied in a variety of other forms, furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:
1. A method of patterning a substrate, comprising:
dispensing droplets of a resist onto a first region and a second region of a surface;
pressing a patterned portion of an imprint template into the resist in the first region;
curing the resist on the surface;
removing the imprint template from the resist;
acquiring an image of the resist in the second region; and
evaluating the wettability of the resist based on the acquired image, wherein
the patterned portion of the imprint template is on a protruded surface and the resist in the second region is not in contact with the protruded surface when the patterned portion is pressed into the resist in the first region.

2. The method according to claim 1, further comprising:
removing the resist in the second region if the wettability satisfies a predetermined standard; and
transferring a pattern of the resist printed in the first region into the surface after the removing of the resist in the second region.

3. The method according to claim 1, further comprising:
removing the resist in the first region and the second region if the wettability does not satisfy a predetermined standard; and
processing the surface after removing the resist to change wettability.

4. The method according to claim 1, further comprising:
removing the resist in the second region if the wettability satisfies a predetermined standard; and
transferring a pattern of the resist printed in the first region into the surface after the removing of the resist in the second region.

5. The method according to claim 1, further comprising:
removing the resist in the first region and the second region if the wettability does not satisfy a predetermined standard; and
processing the surface after removing the resist to change wettability.

6. The method of claim 1, wherein the wettability is evaluated by calculating an average dimensional value of droplets of resist in the second region by image analysis of the acquired image.

7. The method of claim 1, wherein the wettability is evaluated by calculating an occupation ratio for resist in the second region by image analysis of the acquired image.

8. The method of claim 1, wherein the wettability is evaluated by comparison of the acquired image to a standard image.

9. The method of claim 1, further comprising:
treating the surface using a first set of surface treatment processing conditions to modify wettability of the surface prior to dispensing the droplets of the resist onto the first region and the second region of the surface;
removing the resist from the first and second regions of the resist if the wettability is evaluated as failing to meet a predetermined condition; and
re-treating the surface using a second set of surface treatment processing conditions to modify wettability of the surface after removing the resist from the first and second regions.

10. The method of claim 1, wherein the image is acquired using a camera of an imprint apparatus.

11. An imprint apparatus, comprising:
a substrate stage for holding a substrate;
a template stage for holding an imprint template having a patterned region on a protruded surface portion;
a resist dispensing device configured to dispense droplets of a resist on the substrate;
a curing unit configured to cure the resist on the substrate; and
a controller configured to:
cause the resist dispensing device to dispense droplets of the resist onto a first region and a second region of a surface of the substrate;
move at least one of the substrate stage and the template state to press the patterned region of the imprint template into the resist in the first region;
cause the curing unit to cure the resist on the surface;
move at least one of the substrate stage and the template stage to remove the imprint template from the cured resist;
acquire an image of the resist in the second region; and
evaluate the wettability of the resist based on the acquired image, wherein the resist in the second region is not in contact with the protruded surface portion when the patterned region is pressed into the resist in the first region.

12. The imprint apparatus according to claim 11, further comprising:
a camera for aligning the template stage and the substrate stage to each other during an imprint process.

13. The imprint apparatus according to claim 12, wherein the controller acquires the image from the camera.

14. The imprint apparatus according to claim 11, wherein the controller is further configured to evaluate the wettability of the resist using image analysis of the acquired image.

15. The imprint apparatus according to claim 11, wherein the controller is further configured to evaluate the wettability of the resist by calculating an average dimensional value of droplets of resist in the second region by image analysis of the acquired image.

16. The imprint apparatus according to claim 11, wherein the controller is further configured to evaluate the wettability of the resist by calculating an occupation ratio for resist in the second region by image analysis of the acquired image.

17. The imprint apparatus according to claim 11, wherein the controller is further configured to evaluate the wettability of the resist by comparison of the acquired image to a standard image.

18. A method of patterning a substrate using an imprint apparatus, the method comprising:
causing a resist dispensing device to dispense droplets of a resist onto a first region and a second region of a surface of a substrate;
moving at least one of a substrate stage and a template state to press a patterned region of an imprint template into the resist in the first region;
causing a curing unit to cure the resist on the surface;
moving at least one of the substrate stage and the template stage to remove the imprint template from the cured resist;
acquiring an image of the resist in the second region; and
evaluating the wettability of the resist based on the acquired image, wherein the patterned region of the imprint template is on a protruded surface and the resist in the second region is not in contact with the protruded surface when the patterned region is pressed into the resist in the first region.

19. The method of claim 18, wherein the image is acquired by a camera also used for aligning the substrate stage and the template stage for pressing the patterned region of the imprint template into the resist in the first region.

* * * * *